(12) United States Patent
Kyoto et al.

(10) Patent No.: US 10,498,107 B1
(45) Date of Patent: Dec. 3, 2019

(54) LASER DEVICE

(71) Applicant: Mitsubishi Electric Corporation, Tokyo (JP)

(72) Inventors: Tomohiro Kyoto, Tokyo (JP); Junichi Nishimae, Tokyo (JP); Tomotaka Katsura, Tokyo (JP); Daiji Morita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/344,821

(22) PCT Filed: Jan. 20, 2017

(86) PCT No.: PCT/JP2017/001924
§ 371 (c)(1),
(2) Date: Apr. 25, 2019

(87) PCT Pub. No.: WO2018/134966
PCT Pub. Date: Jul. 26, 2018

(51) Int. Cl.
H01S 5/14 (2006.01)
H01S 5/40 (2006.01)

(52) U.S. Cl.
CPC ............ H01S 5/4087 (2013.01); H01S 5/141 (2013.01); H01S 5/4012 (2013.01)

(58) Field of Classification Search
CPC ....... H01S 5/4087; H01S 5/141; H01S 5/4012
See application file for complete search history.

(56) References Cited

U.S. PATENT DOCUMENTS

2006/0171428 A1* 8/2006 Volodin .................. H01S 5/065 372/9
2011/0216417 A1 9/2011 Chann et al.
2013/0215916 A1* 8/2013 Kakizaki ............. H01S 3/10092 372/21
2015/0333485 A1 11/2015 Tayebati et al.
2016/0268761 A1 9/2016 Tayebati et al.
2016/0276799 A1 9/2016 Shoda et al.

FOREIGN PATENT DOCUMENTS

JP 2015-513792 A 5/2015
JP 2016-96333 A 5/2016
WO 2015/083200 A1 6/2015

OTHER PUBLICATIONS

International Search Report and Written Opinion dated Mar. 14, 2017 for PCT/JP2017/001924 filed on Jan. 20, 2017, 8 pages with translation of the International Search Report.
Decision to Grant a Patent received for Japanese Patent Application No. 2017-533509, dated Aug. 15, 2017, 6 pages including translation.

* cited by examiner

Primary Examiner — Yuanda Zhang
(74) Attorney, Agent, or Firm — Xsensus LLP

(57) ABSTRACT

A laser device causes, with a plurality of laser media that generate laser beams having wavelengths different from one another, a convergent lens to cause laser beams each emitted from the plurality of laser media to overlap one another on a dispersive element to form a single combined beam. The dispersive element is positioned where the plurality of laser beams are caused to overlap one another by the convergent lens to form a single beam, causes a portion of the plurality of laser beams to return back toward the laser media as a first laser beam flux, and outputs another portion of the plurality of laser beams as a second laser beam flux having a single optical axis.

10 Claims, 6 Drawing Sheets

LASER DEVICE

CROSS-REFERENCE TO RELATED APPLICATION

The present application is based on PCT filing PCT/JP2017/001924 filed Jan. 20, 2017, the entire contents of which are incorporated herein by reference.

FIELD

The present invention relates to a wavelength-beam-combined laser device that combines multiple laser beams having different wavelengths to output a high power laser beam.

BACKGROUND

A conventional laser device disclosed in Patent Literature 1 is configured to cause multiple laser beams having different wavelengths to overlap one another on a dispersive element, which is a diffraction grating, to generate a single combined laser beam by utilizing a dispersive effect, and reflect a portion of this combined laser beam using a partially reflective mirror back into the laser media thus to form a resonator, and extract, as an output, a component of the combined laser beam that passes through the partially reflective mirror.

CITATION LIST

Patent Literature

Patent Literature 1: U.S. Patent Application Publication No. 2011/0216417

SUMMARY

Technical Problem

However, the conventional laser device disclosed in Patent Literature 1 is configured such that, upon reflection of a portion of the combined laser beam back toward the laser media, the laser beam passes through the dispersive element. Thus, that conventional laser device suffers from a disadvantage in that a loss in the dispersive element reduces beam power and reduces energy efficiency.

The present invention has been made in view of the foregoing, and it is an object of the present invention to provide a laser device capable of reducing or preventing decreases in beam power and in energy efficiency.

Solution to Problem

There is provided a laser device according to an aspect of the present invention that, with a plurality of laser media that generate laser beams having wavelengths different from one another, causes a convergent element to cause laser beams each emitted from the plurality of laser media to overlap one another on a dispersive element to form a single combined beam, wherein the dispersive element is positioned where the plurality of laser beams are caused to overlap one another by the convergent element to form a single beam, causes a portion of the plurality of laser beams to return back toward the laser media as a first laser beam flux, and outputs another portion of the plurality of laser beams as a second laser beam flux having a single optical axis.

Advantageous Effects of Invention

A laser device according to the present invention provides an advantage in being capable of reducing or preventing decreases in beam power and in energy efficiency.

DESCRIPTION OF EMBODIMENTS

A laser device according to embodiments of the present invention will be described in detail below with reference to the drawings. Note that these embodiments are not intended to limit the scope of this invention.

First Embodiment

Figure 1:
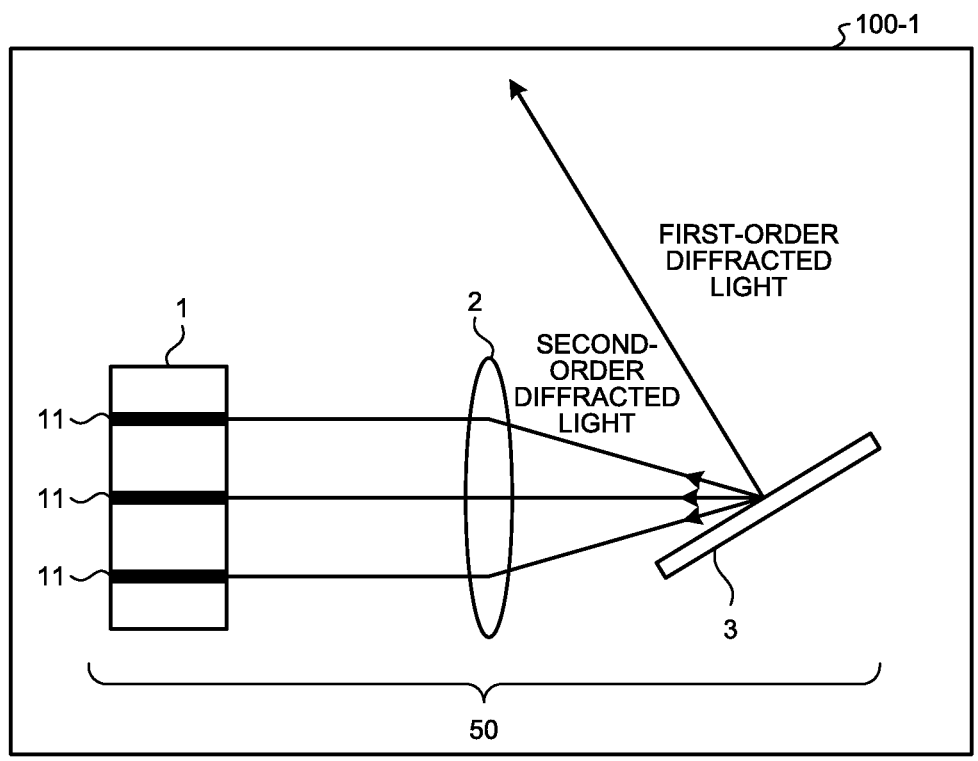
FIG. 1 is a diagram illustrating a configuration of a laser device according to a first embodiment of the present invention.

FIG. 1 is a diagram illustrating a configuration of a laser device according to a first embodiment of the present invention. A laser device 100-1 according to the first embodiment includes a laser unit 1, a dispersive element 3 disposed on the light output side of the laser unit 1, and a convergent lens 2, which is a convergent element, disposed between the laser unit 1 and the dispersive element 3. The dispersive element 3 is positioned where multiple laser beams are made to overlap one another by the convergent lens 2 thus to form a single beam. The dispersive element 3 causes a portion of the multiple laser beams to return back toward laser media 11 as a first laser beam flux, and outputs another portion of the multiple laser beams as a second laser beam flux having a single optical axis.

The laser unit 1 may be, for example, a semiconductor laser array or a semiconductor laser bar. The laser media 11 may together form, for example, a semiconductor laser array. A semiconductor laser bar is a device formed of a single semiconductor chip, including multiple light emitting spots, while a semiconductor laser array is a device incorporating therein multiple semiconductor chips. A semiconductor laser bar may be a part of a semiconductor laser array. The laser beams emitted by the multiple laser media 11 are deflected by the convergent lens 2 with output angles different from one another thus to overlap one another on the dispersive element 3.

The dispersive element 3 may be, for example, a diffraction grating. The dispersive element 3 of the laser device 100-1 is arranged in a so-called Littrow configuration. The term "Littrow configuration" refers to a configuration in which the diffraction grating has a particular number of grooves and is mounted at a particular angle to cause the diffraction angle of second-order diffracted light of each of the multiple laser beams to match the incident angle of the corresponding one of the multiple laser beams at an intended wavelength. The laser device 100-1 including a diffraction grating arranged in a Littrow configuration causes the second-order diffracted light generated by the diffraction grating to become feedback light that returns back to the originating laser medium 11 along the incident beam. This forms a resonator 50 in which the beams operate at wavelengths different to one another between the laser media 11 and the diffraction grating.

The relationship between the incident angle θ on a diffraction grating, the diffraction angle φ at the diffraction grating, and the wavelength λ of a laser beam is given by the grating equation of Equation (1). In Equation (1), d represents the interval of the grooves provided on the diffraction grating, and m represents the order of diffraction.

[Formula 1]

$$d(\sin \phi + \sin \theta) = m\lambda \quad (1)$$

Second-order diffracted light (order of diffraction m=2) during a Littrow operation satisfies Equation (2), where $\varphi_2$ represents the diffraction angle of the second-order diffracted light, and $\theta_{in}$ represents the incident angle on the diffraction grating. A Littrow operation herein refers to an operation that causes the second-order diffracted light generated by the diffraction grating arranged in a Littrow configuration with respect to the second-order diffracted light to return to the laser media 11.

[Formula 2]

$$d(\sin \phi_2 + \sin \theta_{in}) = 2\lambda \quad (2)$$

If the diffraction angle $\varphi_2$ of the second-order diffracted light is equal to the incident angle $\theta_{in}$ on the diffraction grating as represented by Equation (3), the diffraction angle $\varphi_2$ of the second-order diffracted light is given by Equation (4).

[Formula 3]

$$\sin \phi_2 = \sin \theta_{in} \quad (3)$$

[Formula 4]

$$\sin \phi_2 = \sin \theta_{in} = \frac{\lambda}{d} \quad (4)$$

In this situation, the diffraction angle $\varphi_1$ of first-order diffracted light generated simultaneously with the second-order diffracted light is given by Equation (5). That is, the diffraction angle $\varphi_1$ of the first-order diffracted light becomes $\varphi_1=0$ regardless of the value of the wavelength λ of that laser beam.

[Formula 5]

$$\sin \phi_1 = \frac{\lambda}{d} - \sin \theta_{in} = \frac{\lambda}{d} - \frac{\lambda}{d} = 0 \quad (5)$$

The above analysis indicates that, during operation of the laser device 100-1 according to the first embodiment, the first-order diffracted light of each of multiple laser beams having different wavelengths is output in a normal direction to the diffraction grating surface regardless of the wavelength. This can provide a single combined output beam that is coaxially aligned.

Figure 2:
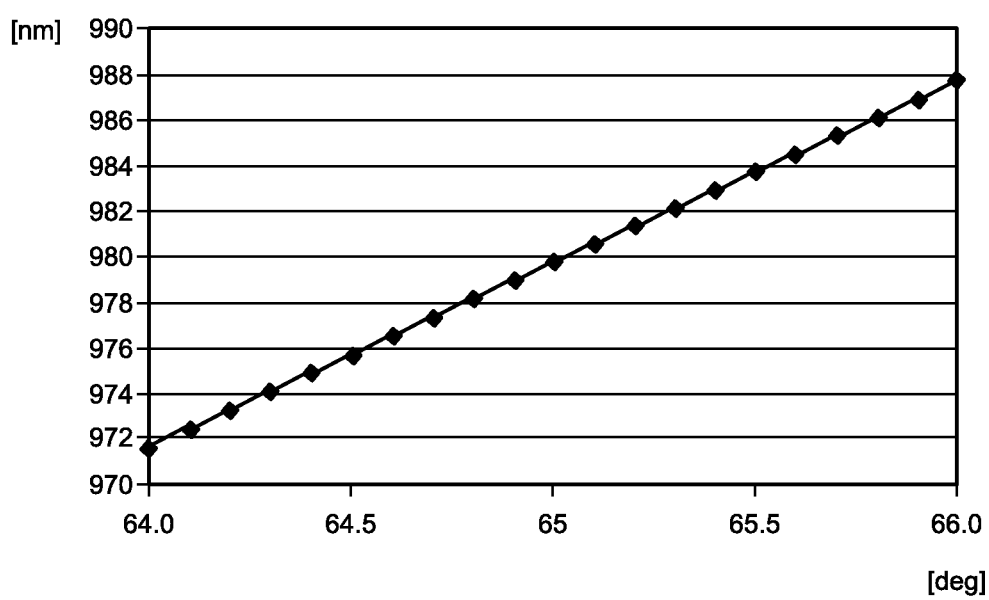
FIG. 2 is a diagram illustrating wavelengths of respective laser beams when second-order diffracted light returns back to the laser media in the laser device according to the first embodiment of the present invention.

An operation of the laser device 100-1 will next be described. FIG. 2 is a diagram illustrating wavelengths of laser beams when the second-order diffracted light returns back to the laser media in the laser device according to the first embodiment of the present invention. The horizontal axis of FIG. 2 represents the incident angle of each of the multiple laser beams incident on the dispersive element 3, and the vertical axis of FIG. 2 represents the wavelength of each of the multiple laser beams incident on the dispersive element 3. FIG. 2 illustrates wavelengths of laser beams when the second-order diffracted light generated by the diffraction grating arranged in a Littrow configuration with respect to the second-order diffracted light returns back to the laser media 11 in a case of overlapping, on the diffraction grating having a spacing of 925 [lines/mm], of the laser beams each output from the multiple laser media 11 arranged to cause the laser beams to be incident on the diffraction grating at incident angles in a range from 64.0 [deg] to 66.0 [deg].

Figure 3:
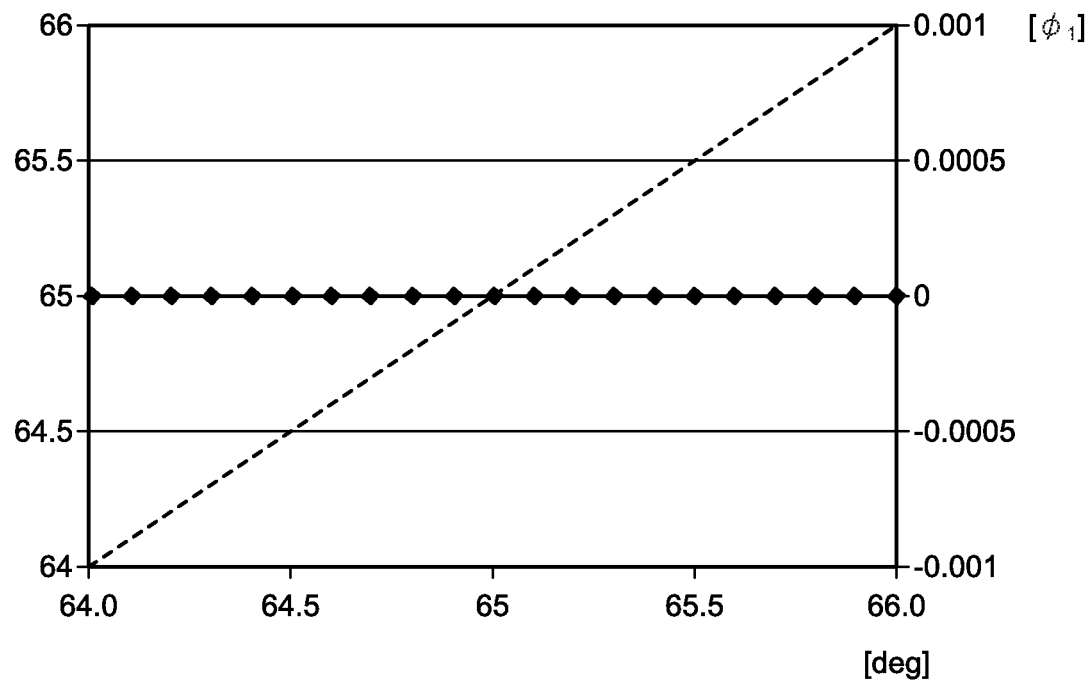
FIG. 3 is a diagram illustrating diffraction angles of first-order diffracted light generated by a diffraction grating arranged in a Littrow configuration with respect to the second-order diffracted light.

FIG. 3 is a diagram illustrating diffraction angles of the first-order diffracted light generated by the diffraction grating arranged in a Littrow configuration with respect to the second-order diffracted light. The horizontal axis of FIG. 3 represents the incident angle [deg] of each of the multiple laser beams incident on the dispersive element 3, and the vertical axis of FIG. 3 represents the diffraction angle $\varphi_1$ of the first-order diffracted light. FIG. 3 illustrates the diffraction angle $\varphi_1$ of the first-order diffracted light generated by the diffraction grating arranged in a Littrow configuration with respect to the second-order diffracted light in a case of overlapping, on the diffraction grating having a spacing of 925 [lines/mm], of the laser beams each output from the multiple laser media 11 arranged to cause the laser beams to be incident on the diffraction grating at incident angles in a range from 64.0 [deg] to 66.0 [deg]. The solid line represents the diffraction angle of the first-order diffracted light, and the dotted line represents the diffraction angle of the second-order diffracted light.

In the resonator 50 of the laser device 100-1, the second-order diffracted light of the laser beam emitted by each of the multiple laser media 11 is fed back to the corresponding one of the multiple laser media 11. This causes the multiple laser media 11 to each oscillate at a wavelength at or near 980 [nm] illustrated in FIG. 2. In this situation, as illustrated in FIG. 3, the first-order diffracted light has the diffraction angle $\varphi_1$ of 0 [deg] for all the laser media 11 arranged for angles in a range from 64 to 66 [deg], thereby providing a single combined output beam.

The description given below provides a comparison between the laser device disclosed in Patent Literature 1 and the laser device 100-1 according to the first embodiment to identify an advantage of the laser device 100-1.

Figure 4:
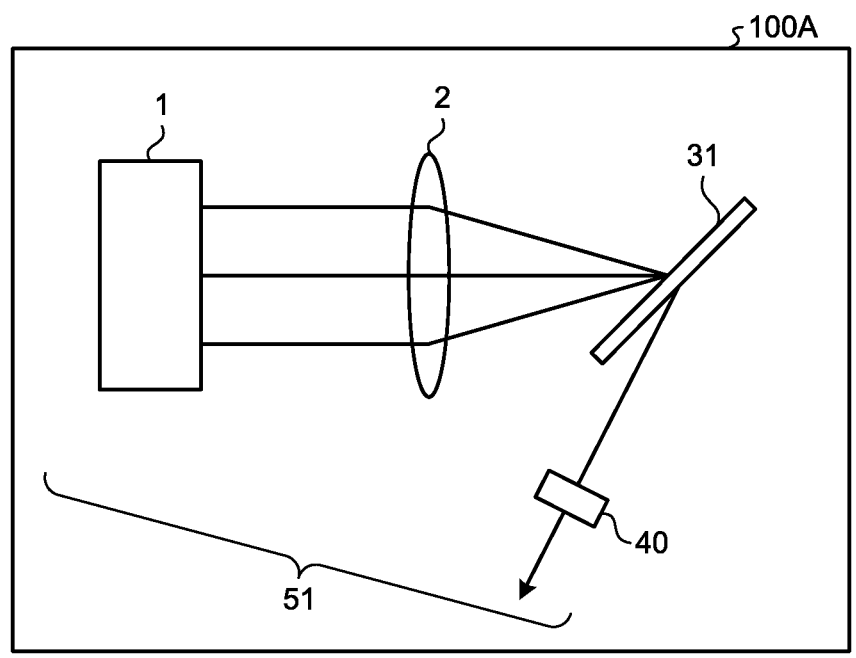
FIG. 4 is a diagram illustrating a configuration of the laser device disclosed in Patent Literature 1.

FIG. 4 is a diagram illustrating a configuration of the laser device disclosed in Patent Literature 1. A laser device 100A disclosed in Patent Literature 1 includes the laser unit 1, the convergent lens 2, a dispersive element 31, and a partially reflective mirror 40. The laser unit 1, the convergent lens 2, the dispersive element 31, and the partially reflective mirror 40 together form a resonator 51.

The laser device 100A outputs a single combined beam of laser beams each emitted from the multiple laser media included in the laser unit 1. In addition, the laser device 100A is configured such that the dispersive element 31 feeds back the multiple laser beams individually, and thus obtains information on wavelengths for enabling the resonator 51 to operate normally. This determines the wavelengths of the multiple laser beams.

The laser device 100A includes, in the resonator 51, the dispersive element 31 that causes a loss, thereby resulting in a decrease in beam power and a decrease in energy efficiency due to a loss in the dispersive element 31 during repeated propagation of the laser beams within the resonator 51. In addition, the laser device 100A includes plural optical elements, i.e., the partially reflective mirror 40 and the dispersive element 31 that are components of the resonator 51, and thus includes an increased number of components requiring alignment thereof. This configuration is likely to cause unstable beam power.

In contrast, the laser device 100-1 according to the first embodiment uses the dispersive element 3, which generates the second-order diffraction, as a retroreflector that acts to feed back the laser beams each emitted from the multiple laser media 11 to the originating laser media 11, and thus determines the wavelengths of the multiple laser beams. In addition, the laser device 100-1 according to the first embodiment produces a bundled, single combined beam output using a feature that the first-order diffracted light simultaneously generated all has a diffraction angle $\varphi_1$ of 0 [deg].

These functions and action enable the laser device 100-1 according to the first embodiment to restrict a loss caused by the dispersive element 3 to a loss at an end of the resonator 50, and to eliminate a loss within the resonator 50. This minimizes a decrease in beam power and a decrease in energy efficiency due to a loss caused by the dispersive element 3.

Moreover, the laser device 100-1 according to the first embodiment can determine and combine the wavelengths at one time using one dispersive element 3, thereby eliminating the need for the partially reflective mirror 40 illustrated in FIG. 4. This can reduce factors in unstable beam power.

Note that the laser device 100A illustrated in FIG. 4 is a laser device utilizing an in-resonator wavelength combining technique, while the laser device 100-1 according to the first embodiment is a laser device utilizing a new technique called resonator-end wavelength combining technique. The laser device 100A suffers from an effect of loss due to repeated propagation of the laser beams. In contrast to the laser device 100A, the laser device 100-1 according to the first embodiment provides an efficient optical operation, and thus provides high beam power and high energy efficiency. In addition, non-necessity of the partially reflective mirror 40, which is an optical element, enables beam power to be stabilized.

The laser device 100-1 according to the first embodiment is applicable to an external resonator of a semiconductor laser, which is coated with a reflection-reducing coating that is arranged on the light output surface of the laser unit 1 and reduces the reflectance thereof to less than the reflectance of the cleavage plane. A high-gain semiconductor laser can provide higher output power at a lower feedback ratio, which is more likely to provide high slope efficiency. A low feedback ratio means that second-order diffracted light has diffraction efficiency lower than the diffraction efficiency of first-order diffracted light. It is reported that a high feedback ratio reduces the life of a semiconductor laser, and a lower feedback ratio is preferable as long as the wavelengths can be certainly determined. The laser device 100-1 according to the first embodiment causes 10% or less of the laser beams to return back toward the laser media as the first laser beam flux, thereby achieving higher energy efficiency, and increasing the life of the device.

Figure 5:
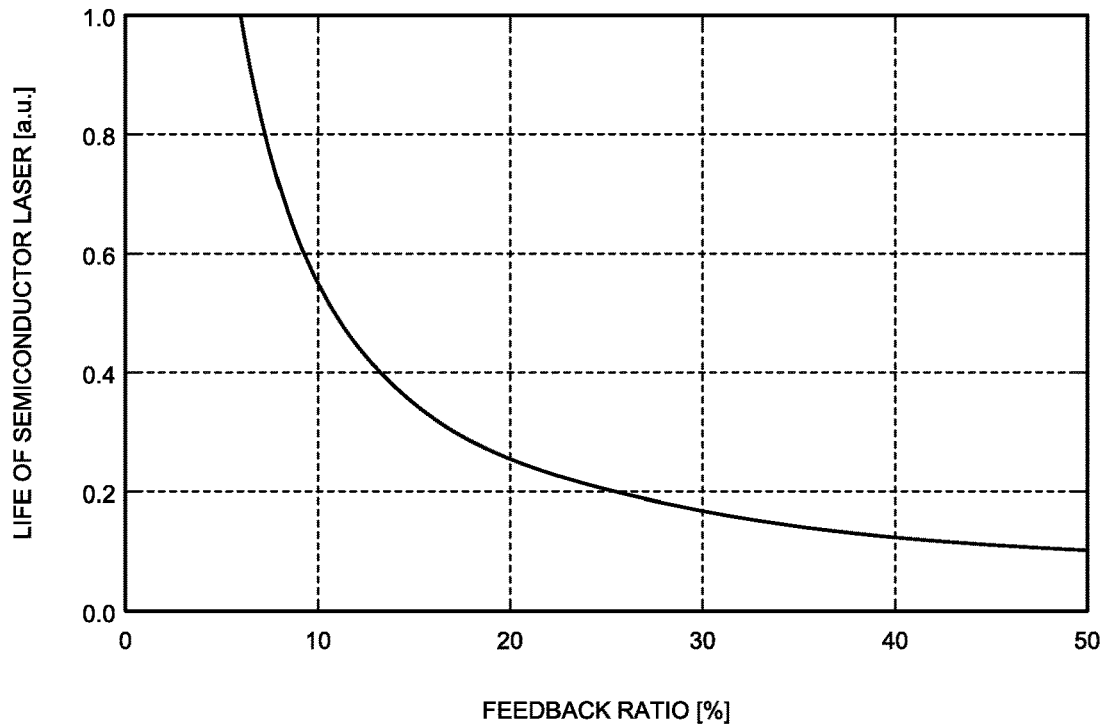
FIG. 5 is a diagram illustrating a relationship of the life of a semiconductor laser with respect to the feedback ratio.

FIG. 5 is a diagram illustrating a relationship of the life of a semiconductor laser with respect to the feedback ratio. The vertical axis of FIG. 5 represents the life of a semiconductor laser, and the horizontal axis of FIG. 5 represents the feedback ratio of second-order diffracted light that returns back to the laser media 11 along the incident beams. The life of a semiconductor laser decreases with an increase in the feedback ratio. Therefore, a lower feedback ratio is desirable in view of the life of laser device. The characteristic of the life of a semiconductor laser with respect to the feedback ratio as illustrated in FIG. 5 shows that a feedback ratio of 10% or higher at least halves the life of a semiconductor laser with respect to when the light output end surface of the semiconductor laser is coated with a partially reflective coating to use the semiconductor laser without an external resonator (feedback ratio is typically several percent). Thus, to achieve the feedback ratio of 10% or less, the dispersive element 3 that provides the feedback action desirably has second-order diffraction efficiency of 10% or less.

Meanwhile, a decrease in the feedback ratio, that is, the return ratio of beams returning from the external resonator to the semiconductor laser, may cause difficulties in control of oscillation wavelength of the semiconductor laser by the external resonator. This is because the light output surface of the semiconductor laser is coated with a reflection-reducing coating as described above, but a reflectance of up to 0.5% still remains; and a decrease in the return ratio of beams returning from the external resonator may change the oscillation mechanism from external oscillation to oscillation caused by the reflectance remaining on the semiconductor laser light output surface. Thus, there is a trade-off between the life of a semiconductor laser and the effectiveness of the external resonator. The feedback ratio needs to be determined based on this trade-off relationship. To provide both a longer life of a semiconductor laser and the effectiveness of the external resonator, the feedback ratio is desirably in a range from 2% to 10%.

In addition, to provide an operation that provides higher energy efficiency, increasing of the output efficiency of the first-order diffracted light to be extracted is advantageous. The dispersive element 3 simultaneously generating both the second-order diffracted light and the first-order diffracted light generates both positive first-order diffracted light and negative first-order diffracted light. In this situation, when a structure of the dispersive element 3 is symmetric and a characteristic of generation of the positive first-order diffracted light and of the negative first-order diffracted light by the dispersive element 3 are the same, it is difficult to increase the first-order diffraction efficiency to 50% or higher, thereby preventing an increase in the efficiency. The term "first-order diffraction efficiency" refers to a ratio of first-order diffracted light output relative to incident light output. To address this issue, the dispersive element 3 has a blazed profile or a groove structure having two or more steps to configure the dispersive element 3 to differentiate the characteristics of generation of positive first-order diffracted light and of negative first-order diffracted light when the second laser beam flux is a combination of the positive first-order diffracted light and the negative first-order diffracted light from the dispersive element 3. This causes the laser beams incident on the dispersive element 3 to be combined at a higher ratio upon the first-order diffraction, thereby providing an action to increase the energy efficiency.

Second Embodiment

Figure 6:
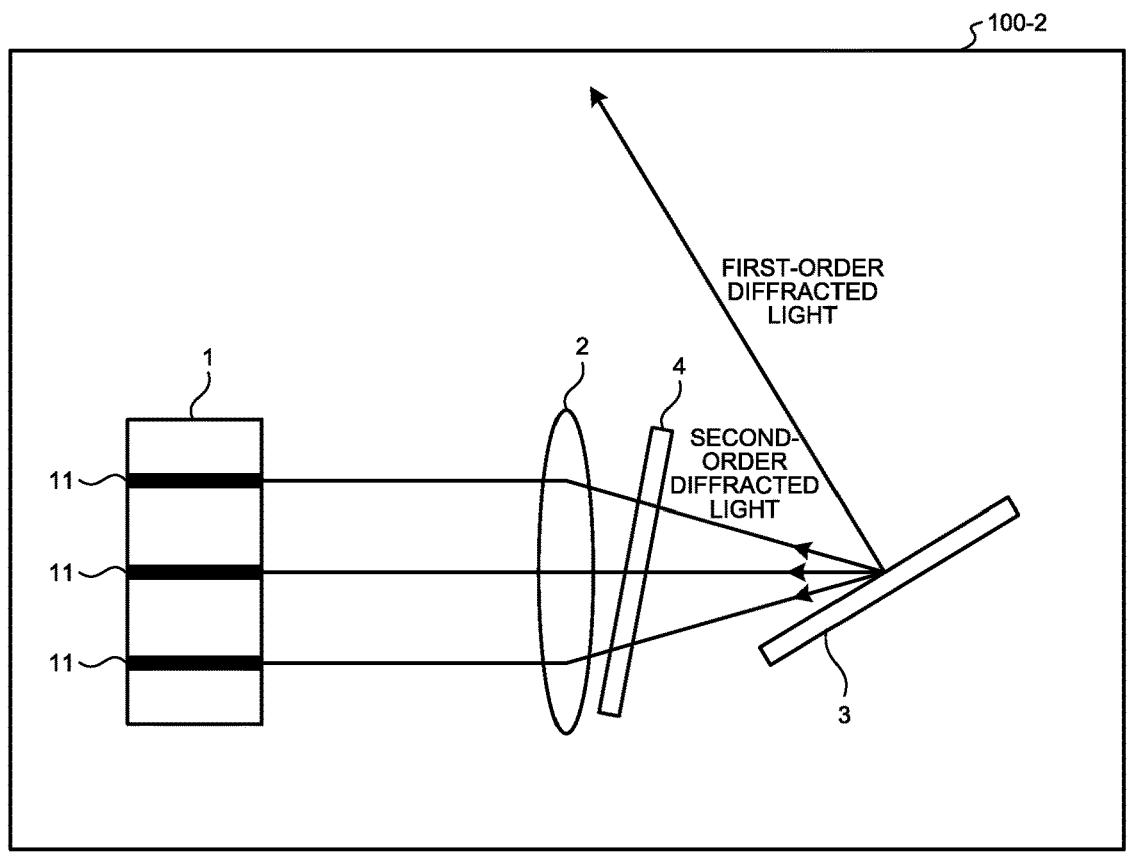
FIG. 6 is a diagram illustrating a configuration of a laser device according to a second embodiment of the present invention.

FIG. 6 is a diagram illustrating a configuration of a laser device according to a second embodiment of the present invention. A laser device 100-2 according to the second embodiment includes a wavelength filter 4 in addition to the laser unit 1, the convergent lens 2, and the dispersive element 3. The wavelength filter 4 is disposed between the convergent lens 2 and the dispersive element 3. The wavelength filter 4 may be, for example, an etalon or a thin film filter.

Generally, a diffraction grating provides a highest reflectance, i.e., highest diffraction efficiency, while being used in a Littrow configuration. This induces use of wavelengths that satisfy the Littrow condition. However, the effect of this alone may fail to reduce or eliminate a so-called crosstalk condition, which refers to a phenomenon that degrades beam quality, due to propagation of the laser beams into different laser media causing oscillation at an unintended wavelength. The laser device 100-2 according to the second embodiment uses the low-loss wavelength filter 4 to reduce or eliminate a crosstalk condition, and can thus provide high beam power and high energy efficiency, and also provide an output with high beam quality.

The description given below provides a comparison between the laser device disclosed in U.S. Patent Application Publication No. 2015/0146282 as an example and the laser device 100-2 according to the second embodiment to identify an advantage of the laser device 100-2. The laser device disclosed in U.S. Patent Application Publication No. 2015/0146282 may be hereinafter referred to simply as "laser device according to the comparative example".

Figure 7:
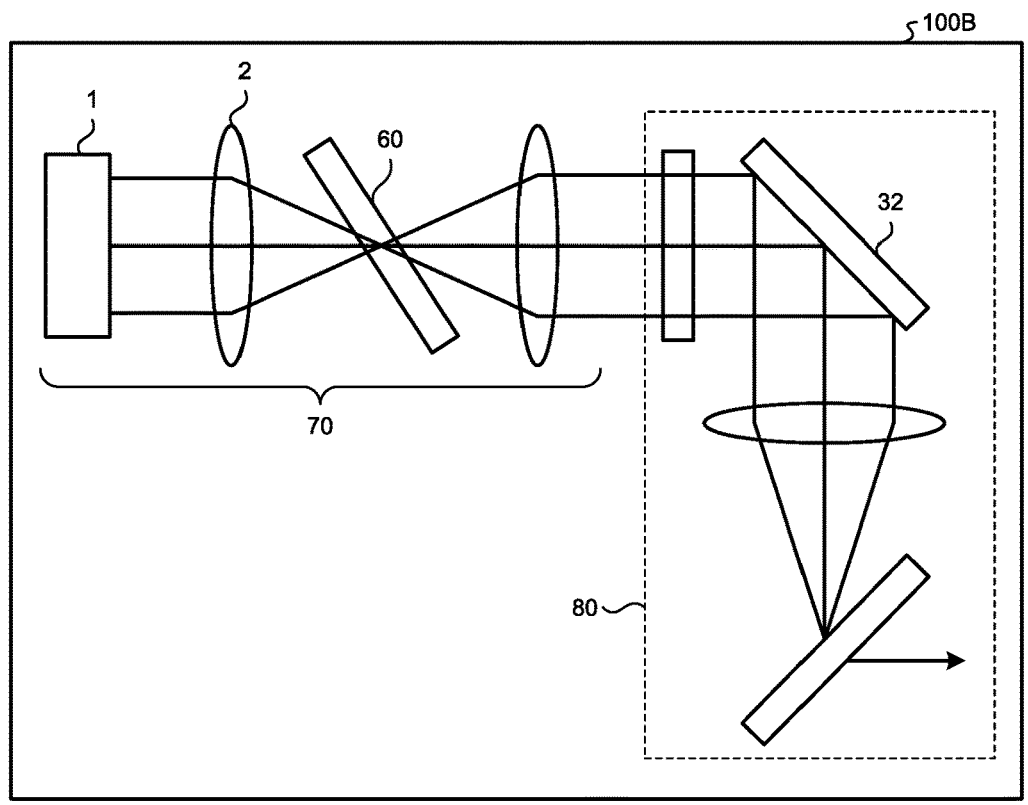
FIG. 7 is a diagram illustrating a configuration of a laser device according to a comparative example.

FIG. 7 is a diagram illustrating a configuration of the laser device according to the comparative example. A laser device 100B according to the comparative example includes a resonator section 70 including, at least, the laser unit 1, the convergent lens 2, and a wavelength filter 60; and a beam combining section 80 including, at least, a dispersive element 32. The laser device 100B according to the comparative example is a laser device utilizing an outside-resonator wavelength combining technique, while the laser device 100-2 according to the second embodiment is a laser device utilizing a new technique called resonator-end wavelength combining technique.

The resonator section 70 of the laser device 100B according to the comparative example determines wavelengths of the multiple laser beams correspondingly, and the beam combining section 80 generates a single combined output beam. Due to angle dependence of both the wavelength filter 60 and the dispersive element 32, a change in the angle of either the resonator section 70 or the beam combining section 80 changes the relationship between the wavelength determination characteristic and the beam combining characteristic, and in turn changes the output beam quality. Moreover, because the resonator section 70 and the beam combining section 80 are included in the laser device 100B according to the comparative example, the configuration becomes more complex than a configuration including merely the resonator section 70, thereby increasing manufacturing cost of the laser device.

In contrast, the laser device 100-2 according to the second embodiment determines and combines the wavelengths of multiple laser beams using one dispersive element 3. This maintains the relationship between the wavelength determination characteristic and the beam combining characteristic, and thus maintains the output beam quality. In addition, the laser device 100-2 has a simpler configuration than the laser device 100B according to the comparative example, thereby enabling manufacturing cost of the laser device to be reduced.

Moreover, the wavelength filter 60 used in the laser device 100B according to the comparative example may permit cyclic selection of multiple wavelengths, and thus requires a filter having a wide free spectral range (FSR) to avoid selection of an unintended wavelength. Due to the tendency of a wide FSR filter to broaden the spectral width, a high-finesse filter is required to obtain a high quality broadband, narrow spectrum beam. On the other hand, a high-finesse filter causes an increased loss, thereby creating difficulties in providing high beam power and high energy efficiency, and also high beam quality.

In contrast, the laser device 100-2 according to the second embodiment is configured such that the dispersive element 3 ensures a narrow spectral width, and thus uses the low-loss wavelength filter 4 only for reducing or eliminating crosstalk. The use of the low-loss wavelength filter 4 to reduce or eliminate crosstalk enables high beam power and high energy efficiency to be provided, and also high beam quality to be provided.

Third Embodiment

Figure 8:
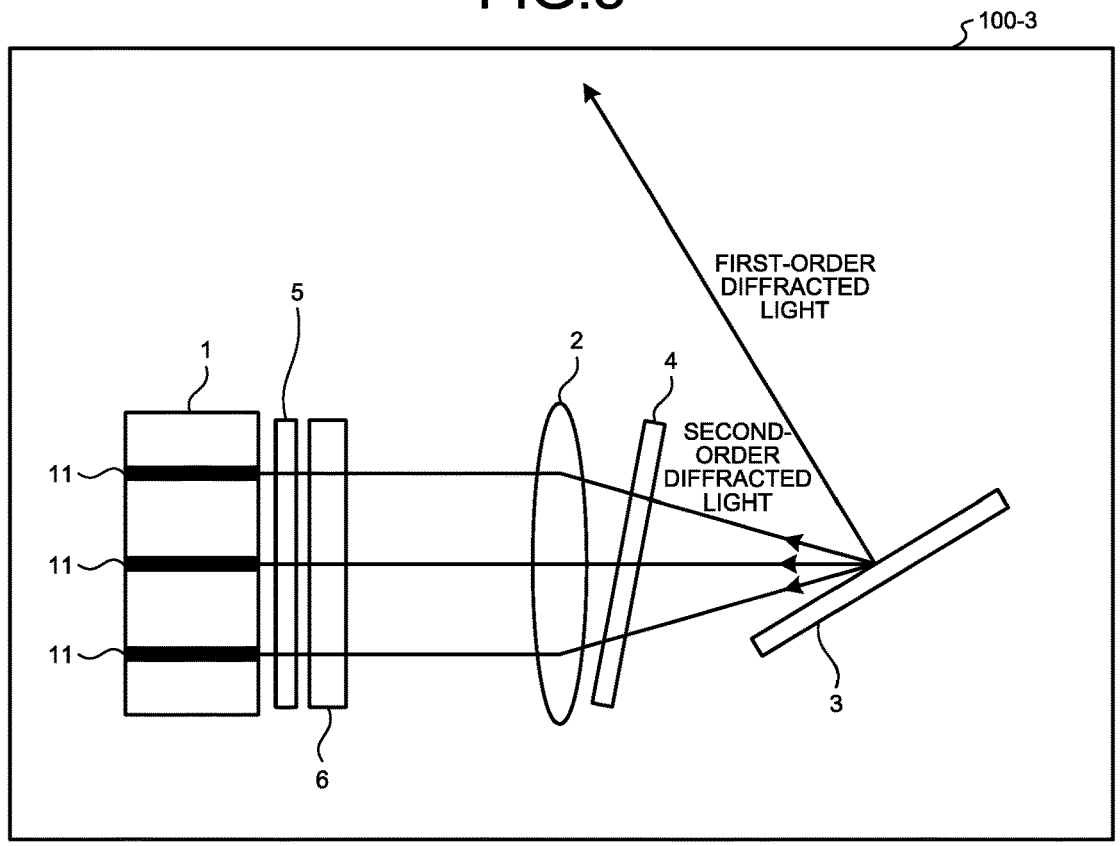
FIG. 8 is a diagram illustrating a configuration of a laser device according to a third embodiment of the present invention.

FIG. 8 is a diagram illustrating a configuration of a laser device according to a third embodiment of the present invention. The laser device 100-3 according to the third embodiment includes the wavelength filter 4, a collimator 5, which is an optical element that collimates multiple laser beams, and a beam rotation element 6, which is an optical element that rotates the beam axis, in addition to the laser unit 1, the convergent lens 2, and the dispersive element 3. The wavelength filter 4 is disposed between the convergent lens 2 and the dispersive element 3. The beam rotation element 6 is disposed between the laser unit 1 and the convergent lens 2. The collimator 5 is disposed between the laser unit 1 and the beam rotation element 6.

The laser device 100-3 according to the third embodiment can provide high energy efficiency. However, simultaneous generation of the second-order diffracted light and the first-order diffracted light imposes a limitation on dispersing ability of the dispersive element 3, thereby requiring longer optical lengths from the laser media 11 to the dispersive element 3 in a case of overlapping of many laser beams. This presents an issue of an increased beam diameter on the dispersive element 3.

This issue is effectively solved by using beams emitted in a beam overlapping direction at divergence angles as small as possible. Considering that a high power broad-area semiconductor laser has a smaller divergence angle along the fast axis direction, alignment of the beam overlapping direction with the fast axis direction is effective. One example of optical element for rotating the laser beams to align the fast axis direction with the beam overlapping direction is disclosed in embodiments in U.S. Pat. No. 5,513,201, and any one thereof can be used. This configuration can provide a reduced divergence angle for each beam along the beam overlapping direction, and can thus reduce the sizes of optical elements downstream of the convergent lens, and can then provide a small-sized, low-cost device. This configuration provides an outstanding advantage in relation to the issue of increased beam size resulting from a longer optical length from a laser medium to the dispersive element, due to limitation on dispersing ability of the dispersive element caused by the use of the dispersive element that simultaneously generates the second-order diffracted light and the first-order diffracted light.

An operation of the laser device 100-3 according to the third embodiment will be described in more detail below. In the present embodiment, the multiple laser beams emitted by the laser media 11 are made to overlap one another at one point on the dispersive element 3 as parallel beams. This optical action corresponds to so-called Fourier transform action, which converts location information of laser beams at spatially different locations into angle information of beam axes. In this regard, the ray transfer matrix of the optical system from the laser media 11 to the dispersive element 3 is shown in Equation (6) and a parameter B is generally an optical distance. D denotes the dispersing ability of the dispersive element 3. The spatial region in which the laser media 11 can be disposed is calculated by "D×B×Δλ". Assuming a common applicable wavelength width Δλ, when a dispersing ability D is small, a large optical distance B is necessary to ensure the spatial region for disposing many laser media 11.

[Formula 6]

$$\begin{bmatrix} 0 & B \\ -\frac{1}{B} & 0 \end{bmatrix} \quad (6)$$

Because the laser device 100-3 according to the third embodiment is configured such that the dispersive element 3 generates both the first-order diffracted light and the second-order diffracted light, the diffraction angle of the second-order diffracted light needs to be less than 180°. This limits the dispersing ability such that the diffraction angle of the second-order diffracted light is less than 180°. Assuming that the dispersive element 3 is a diffraction grating, when a diffraction grating having up to 1800 lines instead of using second-order diffracted light can be used, the laser device 100-3 that uses second-order diffracted light is limited to use a diffraction grating having up to 900 lines. This indicates that disposition of the same laser media 11 requires longer optical distances, thereby resulting in a larger beam size on the dispersive element 3. As used herein, the phrase "disposition of the same laser media 11" means that disposition of the same number of laser media each having the same size and the same beam divergence angle as those of the laser media in a conventional laser device that does not use second-order diffracted light, in the laser device according to the present embodiment that uses second-order diffracted light. Note that the beam size on the dispersive element 3 is calculated by "beam divergence angle×optical distance B".

This issue is effectively solved by reduction in the beam divergence angle along the beam overlapping direction. Thus, the beam rotation element 6 that aligns directions of small beam divergence angles with the beam overlapping direction provides an outstanding advantage in the third embodiment. A configuration that relaxes the restrictions on the dispersing ability, which is a problem in the third embodiment, may be, for example, a configuration using an immersion grating or a grism that exerts a dispersive effect in a high refractive index medium.

Fourth Embodiment

Figure 9:
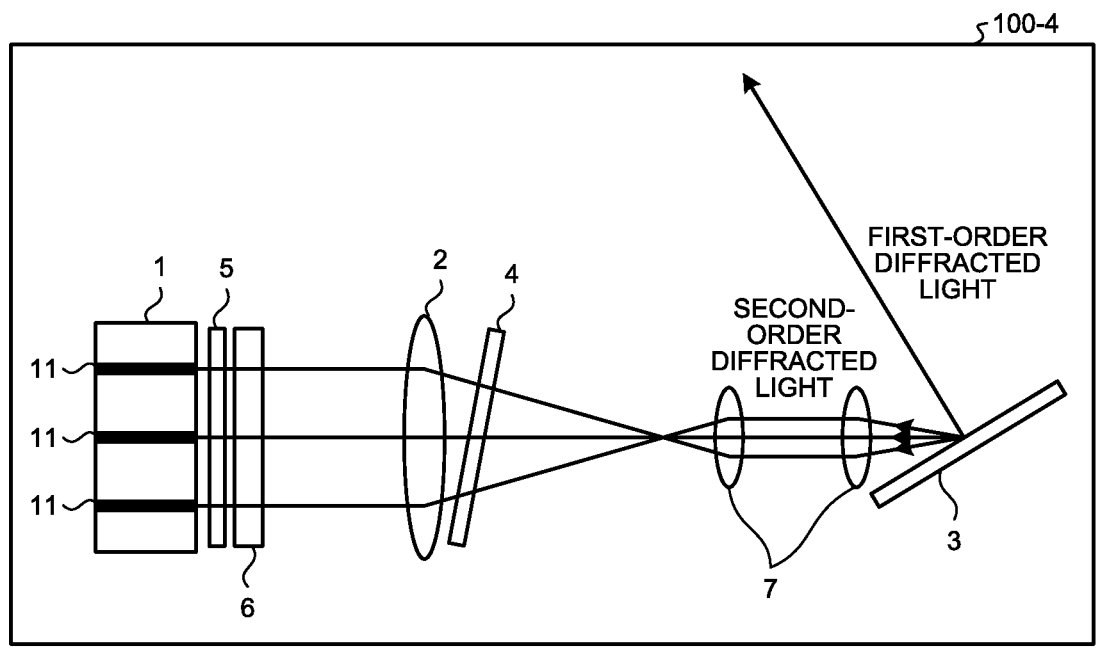
FIG. 9 is a diagram illustrating a configuration of a laser device according to a fourth embodiment of the present invention.

FIG. 9 is a diagram illustrating a configuration of a laser device according to a fourth embodiment of the present invention. In addition to the components included in the laser device 100-3 according to the third embodiment, a laser device 100-4 according to the fourth embodiment includes a relay optical system 7 that relays the overlapping plane of the multiple laser beams onto the dispersive element 3. The relay optical system 7 is disposed between the wavelength filter 4 and the dispersive element 3. The laser device 100-4 can adjust the relationship between the characteristic of the wavelength filter 4 and the characteristic of the dispersive element 3 in the third embodiment, thereby allowing increased design flexibility using low-cost general products. This can reduce manufacturing cost of the laser device.

Fifth Embodiment

Figure 10:
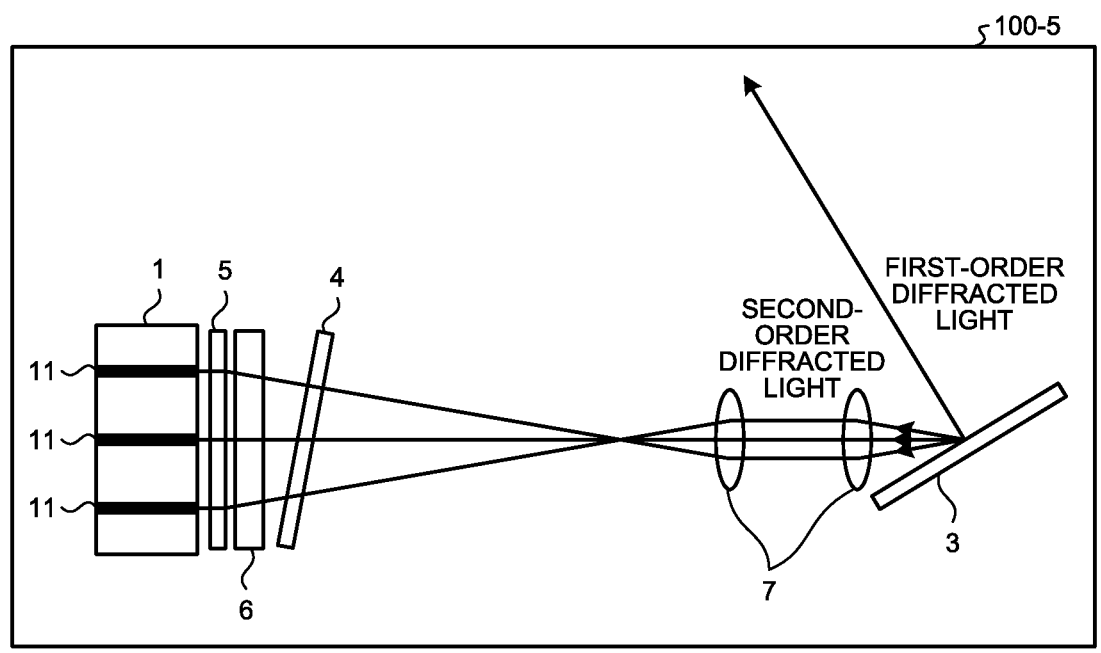
FIG. 10 is a diagram illustrating a configuration of a laser device according to a fifth embodiment of the present invention.

FIG. 10 is a diagram illustrating a configuration of a laser device according to a fifth embodiment of the present invention. A laser device 100-5 according to the fifth embodiment has the collimator 5 in a tilted position, and the use of the collimator 5 in a tilted position enables the convergent lens 2 to be omitted. The laser device 100-5 allows the convergent lens 2 to be omitted, and can thus reduce manufacturing cost of the laser device.

Sixth Embodiment

Figure 11:
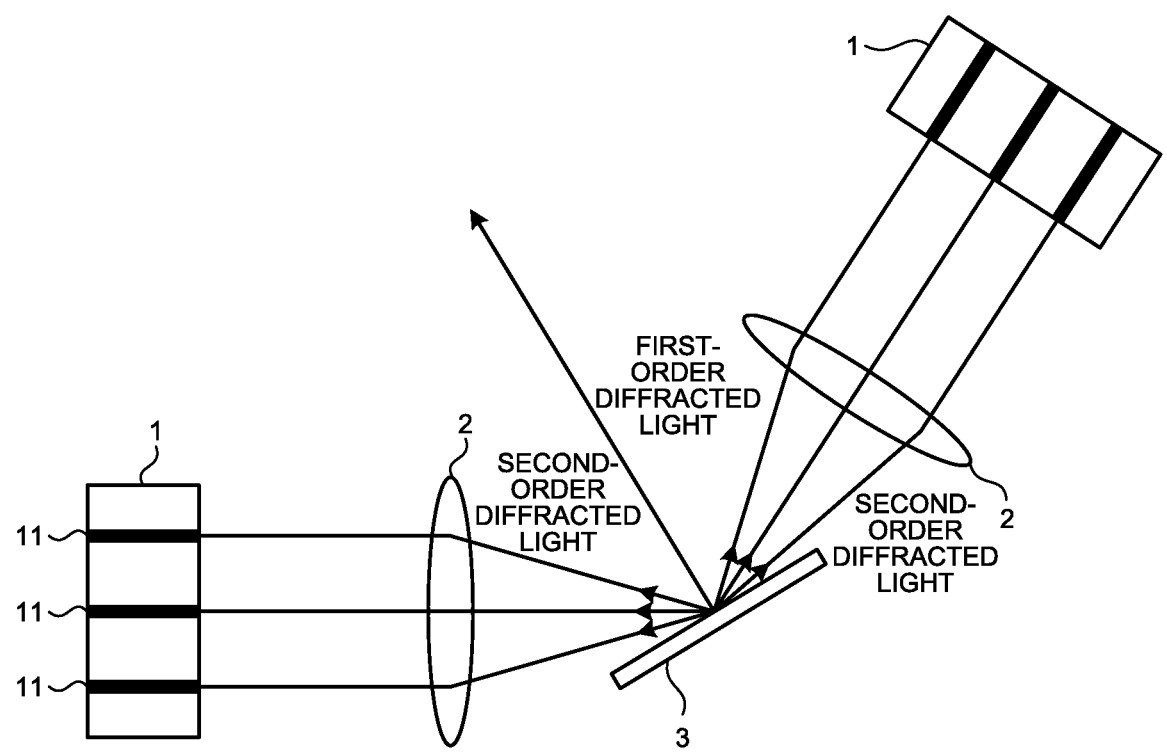
FIG. 11 is a diagram illustrating a configuration of a laser device according to a sixth embodiment of the present invention.

FIG. 11 is a diagram illustrating a configuration of a laser device according to a sixth embodiment of the present invention. The laser device according to the sixth embodiment includes two laser units 1, and laser beams from the multiple laser units 1 are caused to overlap one another on the dispersive element 3. In the laser device according to the sixth embodiment, the multiple laser media are disposed across the normal to the surface of the dispersive element 3 at positions where laser beams from the multiple laser media are incident on the dispersive element 3 at positive and negative angles. This configuration enables light from a larger number of laser media to overlap one another, and can thus provide an advantage in increasing power and brightness.

If the second laser beam flux is positive first-order diffracted light or negative first-order diffracted light from the dispersive element 3, the laser device according to any one of the first to fifth embodiments may additionally include an optical system that collects zeroth-order diffracted light generated by the dispersive element 3. This configuration enables zeroth-order diffracted light to be collected that would otherwise cause a loss, thereby improving energy efficiency. Zeroth-order diffracted light is inevitably generated in the dispersive element 3, and generally causes a loss. One example of collection and use of zeroth-order diffracted light is disclosed in U.S. Patent Application Publication No. 2015/0333485. However, the zeroth-order diffracted light and a derived beam thereof are contained between highly reflective surfaces, thereby causing difficulties in combining with the output. This prevents an effective action. In the present embodiment, the dispersive element 3 is used which includes three ports to generate zeroth-order diffracted light, first-order diffracted light, and second-order diffracted light. The dispersive element 3 acts as a kind of circulator, and can thus collect zeroth-order diffracted light combined with the output. Thus, the optical system that collects zeroth-order diffracted light provides an outstanding advantage in a configuration using the dispersive element 3 that simultaneously generates both first-order diffracted light and second-order diffracted light.

The configurations described in the foregoing embodiments are merely examples of various aspects of the present invention. These configurations may be combined with a known other technology, and moreover, a part of such configurations may be omitted and/or modified without departing from the spirit of the present invention.

REFERENCE SIGNS LIST 1 laser unit; 2 convergent lens; 3, 31, 32 dispersive element; 4 wavelength filter; 5 collimator; 6 beam rotation element; 7 relay optical system; 11 laser medium; 40 partially reflective mirror; 50, 51 resonator; 60 wavelength filter; 70 resonator section; 80 beam combining section; 100-1, 100-2, 100-3, 100-4, 100-5, 100A, 100B laser device.

The invention claimed is:

1. A laser device that includes a plurality of laser media that generate laser beams having wavelengths different from one another, and causes a convergent element to cause laser beams each emitted from the plurality of laser media to overlap one another on a dispersive element to form a single combined beam,
   wherein the dispersive element is positioned where the plurality of laser beams are caused to overlap one another by the convergent element to form a single beam, causes second-order diffracted light of each of the laser beams having wavelengths different from one another to return back to a corresponding one of the laser media, and outputs positive first-order diffracted light and negative first-order diffracted light of laser beams having wavelengths different from one another as a laser beam flux having a single optical axis.

2. The laser device according to claim 1, wherein the dispersive element is arranged in a Littrow configuration, and
   the Littrow configuration causes the positive first-order diffracted light and the negative first-order diffracted light to be emitted, and causes the second-order diffracted light of each of the laser beams to return back to the corresponding one of the laser media.

3. The laser device according to claim 1, wherein, the dispersive element has a diffraction efficiency of greater than 50% for of the positive first-order diffracted light or the negative first-order diffracted light.

4. The laser device according to claim 1, comprising:
   a wavelength filter disposed between the laser medium and the dispersive element.

5. The laser device according to claim 1, comprising:
   a collimator to collimate the plurality of laser beams.

6. The laser device according to claim 1, comprising:
   a beam rotation element to rotate beam axes of the plurality of laser beams.

7. The laser device according to claim 1, comprising:
   a relay optical system to relay an overlapping plane of the plurality of laser beams onto the dispersive element.

8. The laser device according to claim 5, wherein the collimator is angled with respect to a plane, in which light incident onto the dispersive element and light diffracted from the dispersive element propagate, to deflect a main ray emitted from the laser media.

9. The laser device according to claim 1, wherein, the laser device includes an optical system to collect zeroth-order diffracted light generated by the dispersive element.

10. The laser device according to claim 1, wherein the plurality of laser media are disposed across a normal to a surface of the dispersive element at positions where laser beams from the plurality of laser media are incident on the dispersive element at positive and negative angles.

* * * * *